United States Patent
Magana et al.

(10) Patent No.: US 7,982,427 B2
(45) Date of Patent: Jul. 19, 2011

(54) VOLTAGE MEASUREMENT OF HIGH VOLTAGE BATTERIES FOR HYBRID AND ELECTRIC VEHICLES

(75) Inventors: Albert Trenchs Magana, Valls (ES); Pere Lopez Veraguas, Valls (ES)

(73) Assignee: Renault s.a.s., Boulogne Billancourt (FR)

( * ) Notice: Subject to any disclaimer, the term of this patent is extended or adjusted under 35 U.S.C. 154(b) by 701 days.

(21) Appl. No.: 12/118,244

(22) Filed: May 9, 2008

(65) Prior Publication Data

US 2009/0278545 A1 Nov. 12, 2009

(51) Int. Cl.
*H02J 7/04* (2006.01)
*H02J 7/00* (2006.01)
*H02J 7/16* (2006.01)

(52) U.S. Cl. ........ 320/104; 320/134; 320/136; 324/426; 324/433; 903/903

(58) Field of Classification Search ............ 320/104, 320/134, 136, 137, 132, 129, 135, 139, 141, 320/142, 143, 145, 148, 149; 324/426, 427, 324/433; 903/903
See application file for complete search history.

(56) References Cited

U.S. PATENT DOCUMENTS

| | | | | |
|---|---|---|---|---|
| 5,444,354 A | * | 8/1995 | Takahashi et al. | 322/28 |
| 5,712,568 A | * | 1/1998 | Flohr et al. | 324/434 |
| 6,087,805 A | * | 7/2000 | Langston et al. | 320/109 |
| 6,114,775 A | * | 9/2000 | Chung et al. | 307/10.1 |
| 6,362,627 B1 | | 3/2002 | Shimamoto et al. | |
| 7,573,238 B2 | * | 8/2009 | Kawai | 320/132 |
| 7,746,049 B2 | * | 6/2010 | Sato | 323/288 |
| 7,812,469 B2 | * | 10/2010 | Asada | 290/40 B |
| 2006/0043933 A1 | * | 3/2006 | Latinis | 320/132 |
| 2006/0108971 A1 | * | 5/2006 | Ono | 320/104 |
| 2009/0278545 A1 | * | 11/2009 | Magana et al. | 324/426 |

* cited by examiner

*Primary Examiner* — Edward Tso
*Assistant Examiner* — Alexis Boateng
(74) *Attorney, Agent, or Firm* — Oblon, Spivak, McClelland, Maier & Neustadt, L.L.P.

(57) ABSTRACT

A system for accurate voltage measurement of a high voltage battery for hybrid and electric vehicles includes a voltage measurement circuit including an analog sensing circuit, a wave generator circuit and a comparator. The analog sensing circuit senses the analog voltage of the high voltage battery. The wave generator circuit generates an analog periodic signal. The comparator receives the sensed analog voltage and the analog periodic signal from the wave generator circuit. The comparator produces an output signal based on the comparison of the inputs, and the output signal takes the form of a digital periodic signal indicative of the voltage of the high voltage battery.

20 Claims, 2 Drawing Sheets

VOLTAGE MEASUREMENT OF HIGH VOLTAGE BATTERIES FOR HYBRID AND ELECTRIC VEHICLES

BACKGROUND OF THE INVENTION

1. Field of the Invention

The invention relates to voltage measurement of high voltage batteries for hybrid and electric vehicles.

2. Background Art

Hybrid and electric vehicles use high voltage batteries to supply power to electric motors and other electric components inside the car. Vehicles also still include low voltage batteries (for example, a 14 volt battery). The control of these electric modules is on the low voltage side of the vehicle electrical system. There is a requirement to have isolation between the high voltage battery side and the low voltage battery side of the system.

The high voltage batteries are referred to as traction batteries as they provide energy for propulsion of the vehicle. In a hybrid or electric vehicle, accurate monitoring of the individual voltages of the traction batteries is very important.

Accurate monitoring facilitates effective charging of the batteries, as well as effective control over the discharging of the batteries as the vehicle operates. An important feature of a battery monitoring system is to maintain the voltage isolation typically provided between the traction batteries and the low voltage portion of the vehicle electrical system, which is typically referred to as chassis ground.

There are existing approaches to measuring voltage of traction batteries, for example, with voltage divider networks or switched inputs to a differential amplifier, and maintaining voltage isolation. There are already circuits designed to sense battery voltage with an isolation barrier, but most of these circuits use analog signals, and therefore they have to provide an isolation between battery side and vehicle side (chassis). The existing circuits use analog components such as linear analog optocouplers or isolated analog amplifiers.

A problem with the kind of components used in these existing circuits is that in some cases several problems of nonlinearity and variations of transfer gain during the life of the component can occur causing measurement error. In these existing circuits, where high accuracy is required, the use of expensive components is expected.

The problem of passing analog signals across an optocoupler has been recognized. An approach to measuring battery voltage has been contemplated in which an amplifier output is coupled to an analog-to-digital converter, which in turn, is coupled to the optocoupler.

Background information may be found in U.S. Pat. Nos. 5,712,568 and 6,362,627.

SUMMARY OF THE INVENTION

It is an object of the invention to provide an improved approach to accurate voltage measurement of the high voltage battery for hybrid and electric vehicles while providing an isolation barrier between the high voltage battery side and vehicle side low voltage (chassis ground).

According to the invention, the high voltage battery of a hybrid or electric vehicle is measured with an isolation barrier. In more detail, the high voltage battery is measured using a periodic signal with pulse width modulation (PWM). Embodiments of the invention may use a simplex circuit, thereby reducing cost. Further, digitization of the measured signal to a periodic signal with PWM increases robustness in front of disturbances present in the high voltage system.

In accordance with the invention, a voltage measurement circuit for measuring the high voltage battery of a hybrid or electric vehicle comprises an analog sensing circuit for sensing voltage of the high voltage battery. The analog sensing circuit produces an analog signal indicative of the voltage of the high voltage battery. The voltage measurement circuit further comprises a wave generator circuit for generating an analog periodic signal.

A comparator has a first input receiving the analog signal indicating the voltage of the high voltage battery. The comparator has a second input receiving the analog periodic signal from the wave generator circuit. The comparator produces an output based on the comparison of the two inputs. The output takes the form of a digital periodic signal indicative of the voltage of the high voltage battery.

In a preferred embodiment, the analog periodic signal is a sawtooth wave. As a result, the comparator output signal has the same period as the analog periodic signal from the wave generator circuit. Further, the comparator output signal has a pulse width indicative of the voltage at the high voltage battery.

It is appreciated that the sawtooth wave is the preferred form of the analog periodic signal from the wave generator circuit. However, other analog periodic signals may be used in alternative embodiments. The sawtooth wave advantageously results in the pulse width of the comparator output signal being proportional to the voltage at the high voltage battery. The use of a different type of analog periodic signal from the wave generator still results in the comparator output taking the form of a digital periodic signal; however, the choice of the analog periodic signal will affect the way that the voltage of the high voltage battery is indicated in the comparator output.

DETAILED DESCRIPTION OF THE PREFERRED EMBODIMENT

Figure 1:
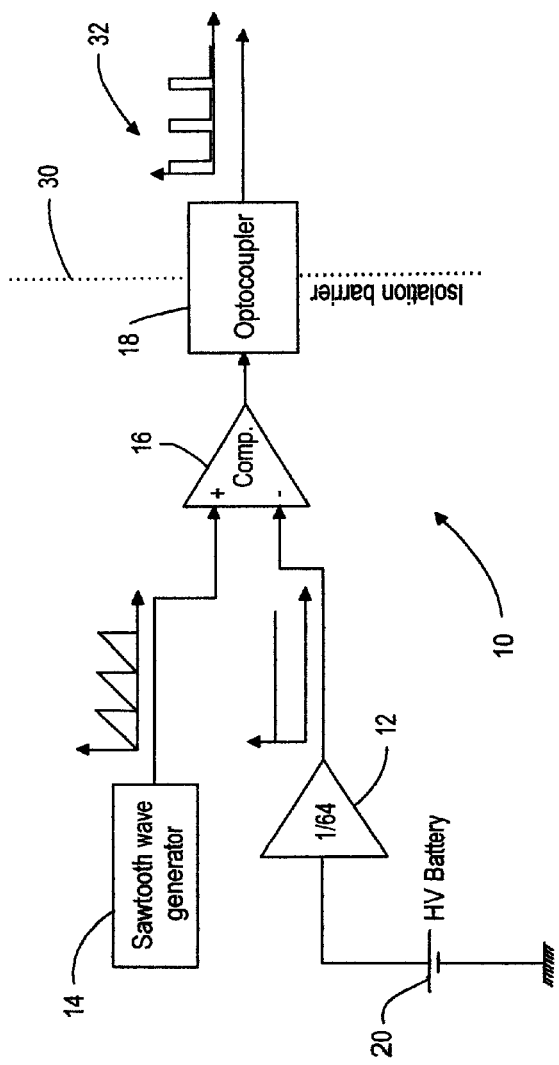
FIG. 1 is a basic diagram of a circuit for measuring the voltage of the high voltage battery of a hybrid or electric vehicle made in accordance with the invention.

FIGS. 1-4 illustrate a circuit for measuring the voltage of the high voltage battery of a hybrid or electric vehicle in an exemplary embodiment of the invention. FIG. 1 illustrates the overall system at 10. The system 10 includes a voltage measurement circuit including an analog sensing circuit 12 for sensing an analog voltage of the high voltage battery 20. A wave generator circuit 14 generates an analog periodic signal. A comparator 16 receives the sensed analog voltage from the analog sensing circuit 12 and receives the analog periodic signal from the wave generator circuit 14. The comparator 16 produces an output signal based on the comparison of the two inputs. An optocoupler 18 receives the comparator output signal, and provides a digital output signal taking the form of a digital periodic signal 32. The digital periodic signal indicates the voltage of the high voltage battery 20. The optocoupler 18 provides an isolation barrier 30 between the high voltage battery and a low voltage system receiving the digital output signal 32.

In the preferred embodiment, the system 10 has high accuracy. The error of measure depends only on the tolerance values of the components of the voltage divisor and voltage reference, and the tolerance values of wave generator circuit 14 do not affect the final measure.

Figure 2:
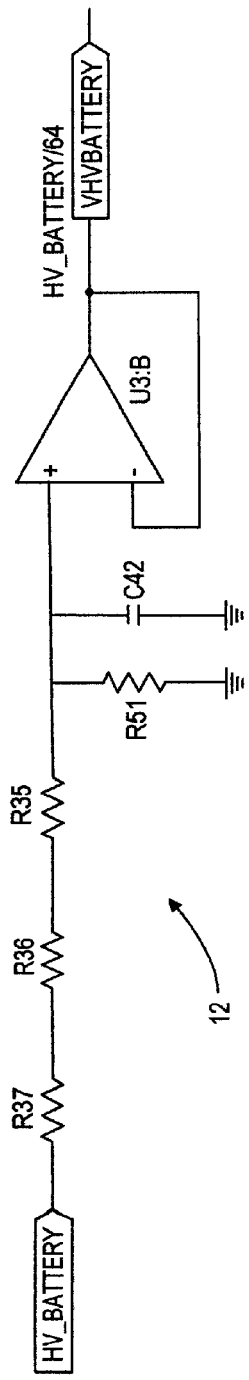
FIG. 2 is a detailed schematic of the voltage divider.

FIG. 2 illustrates the analog sensing circuit 12, which takes the form of a voltage divisor, in further detail. Circuit 12 contains a simple voltage divisor composed of resistors R37, R36, R35, and R51, with an operational amplifier U3:B in voltage follower configuration. Circuit 12 also includes capacitor C42 to provide a low-pass filter. Circuit 12 provides a low voltage signal proportional to the high voltage battery.

Figure 3:
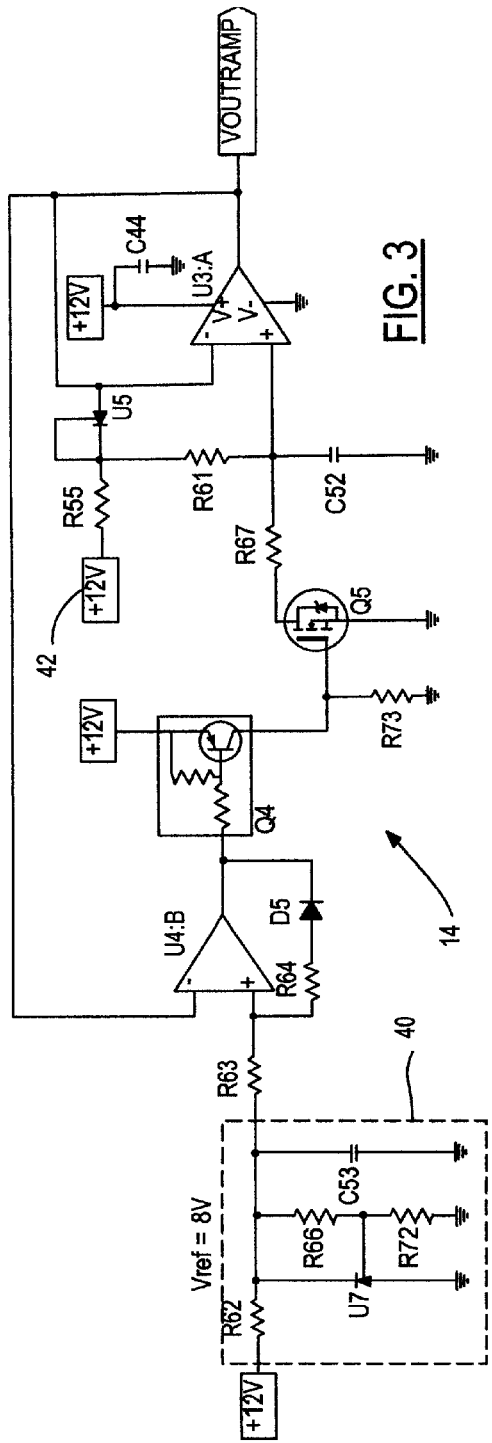
FIG. 3 is a detailed schematic of the sawtooth wave generator.

FIG. 3 illustrates the wave generator circuit 14, which takes the form of a sawtooth wave generator, in further detail. A ramp generator circuit charges capacitor C52 with a constant current source. This part of the circuit is formed by capacitor C52, an operational amplifier U3:A, a voltage reference 40, and various resistors. In more detail, the comparator U4:B resets the voltage capacitor C52 when the output ramp reaches the voltage reference in order to generate a periodic signal. As illustrated, the voltage reference is 8 volts.

To illustrate operation of the circuit 14, initially assume that the capacitor C52 is fully discharged. When the MOSFET Q5 is opened and the capacitor C52 starts charging to the supply voltage, the voltage is increased linearly since the current is constant. When the voltage of capacitor C52 is equal to the voltage reference, the comparator U4:B enables the MOSFET Q5 and shorts capacitor C52 to ground by means of resistor R67. The capacitor C52 is then discharging, and once the voltage goes low, the comparator U4:B opens the MOSFET Q5 and the capacitor C52 starts charging again.

In more detail, voltage regulator 40 is composed of shunt regulator U7, resistors R62, R66, and R72, and capacitor C53. Voltage regulator 40 provides a voltage reference of 8 volts. Comparator U4:B is arranged with input resistor R63 and with resistor R64 and diode D5 in a positive feedback loop. Comparator U4:B receives the output ramp signal at the negative input. The output of comparator U4:B is coupled through transistor Q4 and resistor R73 to MOSFET Q5. When MOSFET Q5 is open, capacitor C52 will charge. When MOSFET Q5 is closed, capacitor C52 will discharge through resistor R67 and the loss at Q5. The voltage on capacitor C52 is connected to operational amplifier U3:A which is in voltage follower configuration. Shunt regulator U5, resistor R55, and voltage source 42 provide a regulated voltage with respect to the operational amplifier output to maintain a constant charging current through resister R61. Capacitor C44 is shown at the high side supply for operational amplifier U3:A.

Figure 4:
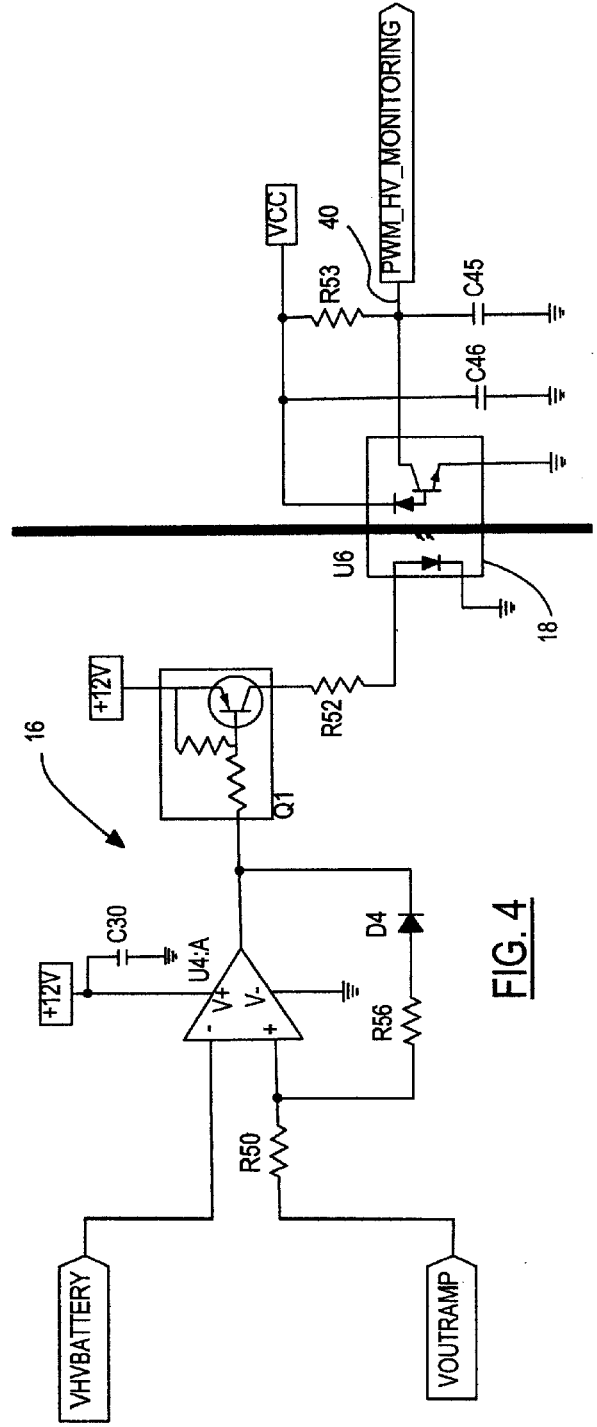
FIG. 4 is a detailed schematic of the comparator and the optocoupler.

FIG. 4 illustrates the comparator circuit 16. As shown, comparator U4:A has two analog input signals. Comparator U4:A receives the sawtooth wave from the wave generator circuit and the sensed analog signal from the voltage battery divisor. Comparator U4:A is arranged with input resistor R50 and positive feedback loop resistor R56 and diode D4. Capacitor C30 is shown at the high side supply for comparator U4:A. Comparator U4:A generates a pulse width modulation on the output, where the pulse width of the output signal is proportional to the battery voltage and the period of the output signal is equal to the period of the sawtooth wave. The optocoupler 18 (U6) sends the pulse width modulated signal from the high voltage battery side to the vehicle side to provide isolation.

In more detail, the output of comparator U4:A is coupled through transistor Q1 and resistor R52 to optocoupler 18 (U6). On the output side of optocoupler 18, resistor R53 and capacitors C46 and C45 are arranged to provide the digital output signal for high voltage monitoring at 40. A microcontroller measures both parameters, the pulse width of the output signal and the period of the output signal, and calculates the voltage of the high voltage battery. In particular, the ratio of the pulse width to the period, the voltage divisor ratio, and the reference voltage allow calculations of the high voltage battery voltage.

Embodiments of the invention have many advantages. For example, the value of the voltage of the high voltage battery is transformed to a digital signal and sent to the vehicle low voltage side by a digital isolation optocoupler. Advantageously, nonlinearity and variations of transfer gain do not affect the final measurement. As well, high speed components (amplifiers, optocouplers) are not required because the frequency of the output signal may be, for example, 100Hz.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A system for accurate voltage measurement of a high voltage battery for hybrid and electric vehicles, the system comprising:
   a voltage measurement circuit including an analog sensing circuit for sensing an analog voltage of the high voltage battery, a wave generator circuit for generating an analog periodic signal, and a comparator,
   the comparator having a first input receiving the sensed analog voltage from the analog sensing circuit, and a second input receiving the analog periodic signal from the wave generator circuit, the comparator producing an output signal based on the comparison of the first and second inputs; and
   an optical coupler receiving the comparator output signal and providing a digital output signal that takes the form of a digital periodic signal indicative of the voltage of the high voltage battery, thereby providing an isolation barrier between the high voltage battery and a low voltage system receiving the digital output signal.

2. The system of claim 1 wherein the analog sensing circuit comprises a voltage divisor.

3. The system of claim 2 wherein the analog sensing circuit further comprises an operational amplifier in voltage follower configuration, the voltage divisor being connected to the operational amplifier.

4. The system of claim 1 wherein the wave generator circuit comprises a sawtooth wave generator, and wherein the analog periodic signal is a sawtooth wave, whereby the digital output signal has a pulse width indicative of the voltage of the high voltage battery.

5. The system of claim 4 wherein the wave generator circuit further comprises:
   a capacitor;
   a constant current source charging the capacitor;
   an operational amplifier in voltage follower configuration, the operational amplifier having an input connected to the capacitor and an output providing the sawtooth wave; and
   a comparator having a first input receiving a reference voltage, and having a second input receiving the operational amplifier output, the comparator resetting the capacitor voltage when the operational amplifier output reaches the reference voltage to generate the sawtooth wave.

6. The system of claim 5 wherein the wave generator circuit further comprises:
a transistor connected across the capacitor, wherein the comparator resets the capacitor voltage by activating the transistor.

7. The system of claim 4 wherein the wave generator circuit further comprises:
a capacitor;
a constant current source charging the capacitor; and
a comparator having a first input receiving a reference voltage, and having a second input receiving a voltage indicative of the capacitor voltage, the comparator resetting the capacitor voltage when the capacitor voltage reaches the reference voltage to generate the sawtooth wave.

8. The system of claim 7 wherein the wave generator circuit further comprises:
a transistor connected across the capacitor, wherein the comparator resets the capacitor voltage by activating the transistor.

9. The system of claim 4 wherein the wave generator circuit further comprises:
a capacitor;
a resistor connected to the capacitor;
an operational amplifier in voltage follower configuration, the operational amplifier having an input connected to the capacitor and an output providing the sawtooth wave;
a voltage regulator connected to a voltage source and connected to the operational amplifier output, the voltage regulator providing a regulated voltage with respect to the operational amplifier output, the regulated voltage charging the capacitor through the resistor to provide charging at a constant current; and
a comparator having a first input receiving a reference voltage, and having a second input receiving the operational amplifier output, the comparator resetting the capacitor voltage when the operational amplifier output reaches the reference voltage to generate the sawtooth wave.

10. The system of claim 9 wherein the wave generator circuit further comprises:
a transistor connected across the capacitor, wherein the comparator resets the capacitor voltage by activating the transistor.

11. A system for accurate voltage measurement of a high voltage battery for hybrid and electric vehicles, the system comprising:
a voltage measurement circuit including an analog sensing circuit for sensing an analog voltage of the high voltage battery, a wave generator circuit for generating an analog periodic signal, and a comparator,
the comparator having a first input receiving the sensed analog voltage from the analog sensing circuit, and a second input receiving the analog periodic signal from the wave generator circuit, the comparator producing an output signal based on the comparison of the first and second inputs, the output signal taking the form of a digital periodic signal indicative of the voltage of the high voltage battery.

12. The system of claim 11 further comprising:
an optical coupler receiving the comparator output signal and providing a digital output signal, thereby providing an isolation barrier between the high voltage battery and a low voltage system receiving the digital output signal from the optical coupler; and
wherein the wave generator circuit further comprises:
a capacitor; and
a current source charging the capacitor.

13. The system of claim 12 wherein the analog sensing circuit comprises a voltage divisor.

14. The system of claim 13 wherein the analog sensing circuit further comprises an operational amplifier in voltage follower configuration, the voltage divisor being connected to the operational amplifier.

15. The system of claim 11 wherein the wave generator circuit comprises a sawtooth wave generator, and wherein the analog periodic signal is a sawtooth wave, whereby the comparator output signal has a pulse width indicative of the voltage of the high voltage battery.

16. The system of claim 11 wherein the wave generator circuit further comprises:
a capacitor;
a constant current source charging the capacitor; and
a comparator having a first input receiving a reference voltage, and having a second input receiving a voltage indicative of the capacitor voltage, the comparator resetting the capacitor voltage when the capacitor voltage reaches the reference voltage to generate the analog periodic signal.

17. The system of claim 16 wherein the wave generator circuit further comprises:
a transistor connected across the capacitor, wherein the comparator resets the capacitor voltage by activating the transistor.

18. The system of claim 11 wherein the wave generator circuit further comprises:
a capacitor;
a resistor connected to the capacitor;
an operational amplifier in voltage follower configuration, the operational amplifier having an input connected to the capacitor and an output providing the analog periodic signal;
a voltage regulator connected to a voltage source and connected to the operational amplifier output, the voltage regulator providing a regulated voltage with respect to the operational amplifier output, the regulated voltage charging the capacitor through the resistor; and
a comparator having a first input receiving a reference voltage, and having a second input receiving the operational amplifier output, the comparator resetting the capacitor voltage when the operational amplifier output reaches the reference voltage to generate the analog periodic signal.

19. The system of claim 18 wherein the wave generator circuit further comprises:
a transistor connected across the capacitor, wherein the comparator resets the capacitor voltage by activating the transistor.

20. A method for accurate voltage measurement of a high voltage battery for hybrid and electric vehicles, the method comprising:
sensing an analog voltage of the high voltage battery;
generating an analog periodic signal;
comparing the sensed analog voltage to the analog periodic signal to produce an output signal based on the comparison; and
wherein the output signal takes the form of a digital periodic signal indicative of the voltage of the high voltage battery.

* * * * *